(12) United States Patent
Wang et al.

(10) Patent No.: US 11,874,326 B2
(45) Date of Patent: Jan. 16, 2024

(54) FLASH SWITCH ON-OFF DETECTION CIRCUIT AND ELECTRONIC DEVICE

(71) Applicant: Beijing Xiaomi Mobile Software Co., Ltd., Beijing (CN)

(72) Inventors: Huijun Wang, Beijing (CN); He Zhang, Beijing (CN); Fan Zeng, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 546 days.

(21) Appl. No.: 16/741,009

(22) Filed: Jan. 13, 2020

(65) Prior Publication Data

US 2021/0132149 A1 May 6, 2021

(30) Foreign Application Priority Data

Nov. 1, 2019 (CN) .......................... 201911060939.6

(51) Int. Cl.
| | | |
|---|---|---|
| *G01R 31/327* | (2006.01) | |
| *G01R 15/20* | (2006.01) | |
| *H02M 1/42* | (2007.01) | |
| *H02M 3/156* | (2006.01) | |
| *H02M 7/06* | (2006.01) | |

(52) U.S. Cl.
CPC ......... *G01R 31/327* (2013.01); *G01R 15/202* (2013.01); *H02M 1/4233* (2013.01); *H02M 3/156* (2013.01); *H02M 7/068* (2013.01)

(58) Field of Classification Search
CPC ............................ G01R 31/327; G01R 15/202; G01R 31/3277; G01R 15/18; H02M 1/4233; H02M 3/156; H02M 7/068; H05B 47/175; H01H 9/167; H01H 2300/03; H01H 9/16; H02J 7/34; H02J 9/061
See application file for complete search history.

(56) References Cited

U.S. PATENT DOCUMENTS 9,036,320 B1  5/2015  Elberbaum

FOREIGN PATENT DOCUMENTS

| | | | |
|---|---|---|---|
| CN | 207460027 U | * | 6/2018 |
| CN | 109951928 A | | 6/2019 |
| CN | 109963394 A | | 7/2019 |
| CN | 110286624 A | | 9/2019 |
| JP | H 063697 B2 | | 1/1994 |

(Continued)

OTHER PUBLICATIONS

Zero crossing detection using comparator circuit. TI, 2018.*

(Continued)

*Primary Examiner* — Son T Le
(74) *Attorney, Agent, or Firm* — Finnegan, Henderson, Farabow, Garrett & Dunner, L.L.P.

(57) ABSTRACT

An on-off detection circuit for a flash switch includes an on-off detection module and a control module. An input end of the on-off detection module is connected with a power supply through the flash switch, the on-off detection module is configured to acquire a digital signal as a detection level according to an electromagnetic signal generated by input current. An input end of the control module is connected with an output end of the on-off detection module, to receive the detection level and determine an on-off state change of the flash switch according to the detection level.

8 Claims, 4 Drawing Sheets

(56) References Cited

FOREIGN PATENT DOCUMENTS

| JP | 2017220859 A | 12/2017 |
| KR | 101741945 B1 | 5/2017 |
| WO | WO-2018035548 A1 * | 3/2018 |
| WO | WO 2019/012104 A1 | 1/2019 |
| WO | WO-2020211114 A1 * | 10/2020 |

OTHER PUBLICATIONS https://en.wikipedia.org/wiki/Comparator.*
Extended European Search Report in European Application No. 20152296.8, dated Jun. 25, 2020.
Notification of Reason for Refusal for Korean Application No. 10-2020-0026696, dated Jan. 24, 2022, 11 pages.
Written Decision on Registration for Korean Application No. 10-2020-0026696, dated Jun. 10, 2022.

* cited by examiner and an electronic device.

FLASH SWITCH ON-OFF DETECTION CIRCUIT AND ELECTRONIC DEVICE

CROSS-REFERENCE TO RELATED APPLICATIONS

The present application is based on and claims priority to Chinese Patent Application No. 201911060939.6, filed on Nov. 1, 2019, the entire contents of which are hereby incorporated by reference.

TECHNICAL FIELD

This disclosure relates to the technical field of flash switches, in particular to a flash switch on-off detection circuit and an electronic device.

BACKGROUND

Flash switches are widely used in smart home equipment. A flash switch in a conventional state stays connection with a power supply and communicates with an electrical load and, when being pressed by an external force, disconnects the power supply from the electrical load. The flash switch can quickly return to the conventional state after the external force is released.

In the smart home equipment, on-off state change of the flash switch is viewed as a trigger signal of the equipment for changing its working state. Thus, it may be needed to detect the on-off state change of the flash switch.

SUMMARY

According to a first aspect of the present disclosure, an on-off detection circuit for a flash switch includes an on-off detection module and a control module; wherein an input end of the on-off detection module is connected with a power supply through the flash switch, the on-off detection module being configured to acquire a digital signal as a detection level according to an electromagnetic signal generated by input current; and an input end of the control module is connected with an output end of the on-off detection module, to receive the detection level and determine an on-off state change of the flash switch according to the detection level.

According to a second aspect of the present disclosure, an electronic device includes a flash switch and an on-off detection circuit for the flash switch. The on-off detection circuit includes an on-off detection module and a control module; an input end of the on-off detection module is connected with a power supply through the flash switch, the on-off detection module being configured to acquire a digital signal as a detection level according to an electromagnetic signal generated by input current; and an input end of the control module is connected with an output end of the on-off detection module, to receive the detection level and determine an on-off state change of the flash switch according to the detection level.

The on-off detection circuit for the flash switch and the electronic device provided by the present disclosure at least have following beneficial effects.

According to the on-off detection circuit for the flash switch, the on-off detection module acquires a digital signal as the detection level according to an electromagnetic signal generated by the input current. Furthermore, the control module determines the on-off state change of the flash switch according to the detection level. By adopting the on-off detection circuit provided by the embodiment of the present disclosure, the control module directly determines the on-off state change of the flash switch according to the detection level, without transforming the signal form of the detection level, such that the detection accuracy can be improved. The circuit according to the embodiment of the present disclosure can be more accurate and reliable in detection, and can optimize the overall detection effect.

BRIEF DESCRIPTION OF THE DRAWINGS

The accompanying drawings, which are incorporated in and constitute a part of the specification, illustrate embodiments of the disclosure and together with the specification serve to explain the principle of the disclosure.

FIG. 5-1 is a schematic diagram of a power conversion module according to one exemplary embodiment.

FIG. 5-2 is a schematic diagram of a power conversion module according to another exemplary embodiment.

DETAILED DESCRIPTION

Figure 1:
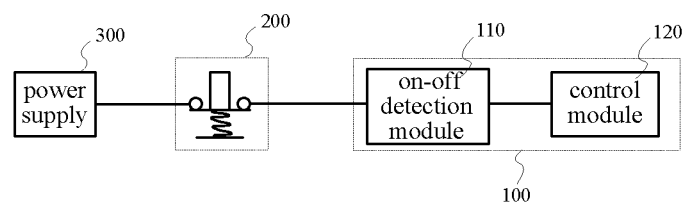
FIG. 1 is a schematic diagram of a flash switch on-off detection circuit according to one exemplary embodiment.

Various embodiments will be described in detail herein, examples of which are illustrated in the drawings. When the following description refers to the drawings, the same numbers in different drawings represent the same or similar elements, unless otherwise indicated. The embodiments described in the following exemplary embodiments do not represent all embodiments consistent with the present disclosure. Instead, they are merely examples of devices and methods consistent with aspects of the present disclosure.

The terms used in the present disclosure are merely directed to illustrate the exemplary embodiments, rather than limit the present disclosure. The term "connect" and the like are not limited to physical or mechanical connection, but may include electrical connection, no matter whether direct or indirect. The singular forms "a," "an," and "the" as used in the present disclosure as well as the appended claims also refer to plural forms unless the contrary is expressly indicated by the context. It should be appreciated that the term "and/or" as used herein refers to any or all possible combination of one or more associated listed items.

In a flash switch on-off detection circuit provided in some embodiments, a controller samples electrical signals passing through the flash switch by using Analog-to-Digital Converter (ADC) technology, and further obtains digital signals, and the on-off state change of the flash switch is determined according to the digital signals.

However, accuracy of on-off detection results by adopting such detection mode may not be high. For example, in the case that an alternating current (AC) power grid voltage is unstable, in a process of transforming a voltage signal into a digital signal, a sampled voltage value may be close to a judgment threshold or fluctuate up and down. As a result, the on-off state change of the flash switch may not be accurately detected.

Due to the above circumstance, embodiments of the present disclosure provide a flash switch on-off detection circuit and an electronic device. FIG. 1 is a schematic diagram of a flash switch on-off detection circuit 100 according to an exemplary embodiment. As shown in FIG. 1, the flash switch on-off detection circuit 100 includes an on-off detection module 110 and a control module 120.

The on-off detection module 110 has an input end connected to a power supply 300 through a flash switch 200. The on-off detection module 110 acquires a detection level according to an electromagnetic signal generated by an input current. The detection level is a digital signal, for representing a use state of the flash switch 200. It should be noted that the use state of the flash switch 200 may be a static use state, for example connection or disconnection, and also be a dynamic use state, for example, from connection to disconnection, or from disconnection to connection.

Figure 2:
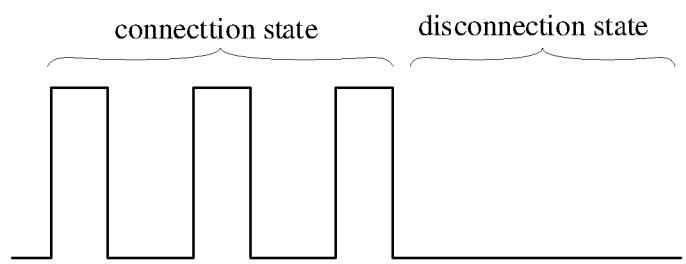
FIG. 2 is a schematic diagram of a detection level output by an on-off detection module in the flash switch on-off detection circuit according to one exemplary embodiment.

As an example, the power supply 300 is an AC power supply, and an input current of the on-off detection module 110 is an AC electrical signal. When the flash switch 200 is in the switching-on state, the AC current electrical signal radiates a varying electromagnetic signal. At this time, the on-off detection module 110 outputs a first detection level, such as a square wave signal as shown in FIG. 2 under the connection state, according to the varying electromagnetic signal. The square wave signal includes a high level and a low level, and a frequency of switching the high level to the low level is the same as a frequency of inputting the AC electrical signal. When the flash switch 200 is in the switching-off state, the on-off detection module 100 does not input the current, while the on-off detection module 110 outputs a second detection level, such as a low level signal as shown in FIG. 2 under the disconnection state.

As another example, the power supply 300 is a DC power supply. When the flash switch 200 is in the switching-on state, the input current of the on-off detection module 110 is a stable DC signal, and the input current radiates a stable electromagnetic signal. When the flash switch 200 is in the switching-off state, the on-off detection module 110 has no input current, so that there is no electromagnetic signal generated by the input current. When the flash switch 200 is in the switching-on state or in the switching-off state, the on-off detection module 110 outputs a third detection level, such as a low level signal. However, when the flash switch 200 is switched from the switching-on state to the switching-off state, or from the switching-off state to the switching-on state, the input current of the on-off detection module 110 is a varying DC signal that radiates a varying electromagnetic signal. The on-off detection module 110 outputs a fourth detection level, such as a high level signal, according to the varying electromagnetic signal.

An input end of the control module 120 is connected to an output end of the on-off detection module 110, to receive the detection level. Furthermore, the control module 120 determines the on-off state change of the flash switch 200 directly according to the received detection level.

In an embodiment, the control module 120 determines whether the currently received signal is a high level or a low level according to a preset level threshold, so as to determine a type of the received detection level (e.g., the square wave signal, the high level signal, or the low level signal). Furthermore, the control module 120 determines whether the state of the flash switch 200 changes according to the type of detection level. The preset level threshold is set according to requirements, and can distinguish the high level and the low level.

In the above embodiments, when the power supply 300 is an AC power supply, the control module 120 receives a first detection level representing that the flash switch 200 is currently in the switching-on state. The control module 120 receives a second detection level representing that the flash switch 200 is currently in the switching-off state. When the power supply 300 is a DC power supply, the control module 120 receives a fourth detection level representing that the flash switch 200 has undergone a state transition (from switching-on to switching-off, or from switching-off to switching-on).

According to the flash switch detection circuit provided by the embodiments, a detection level capable of representing the on-off state change of the flash switch 120 can be obtained according to the electromagnetic signal generated by the input current. The control module 120 determines the on-off state of the flash switch 200 directly according to the detection level. Such arrangement can detect the state change of the flash switch 200 effectively. The control module 120 in the circuit can sample the detection level without using an analog-to-digital conversion technology, to avoid errors in the sampling process and improve the detection accuracy.

Figure 3:
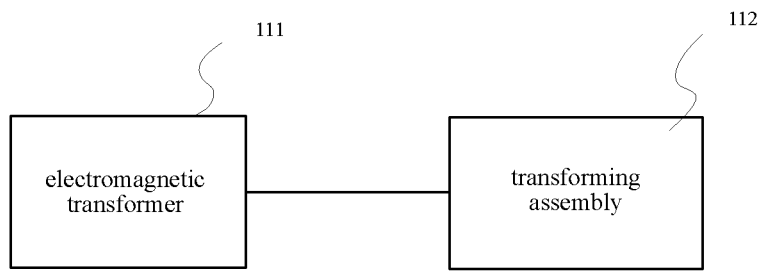
FIG. 3 is a schematic diagram of the on-off detection module in the flash switch on-off detection circuit according to one exemplary embodiment.

In one embodiment, as shown in FIG. 3, the on-off detection module 110 includes an electromagnetic transformer 111 and a transforming assembly 112. An input end of the electromagnetic transformer 111 is the input end of the on-off detection module 110, and an output end of the transforming assembly 112 is the output end of the on-off detection module 110.

The electromagnetic transformer 111 is configured to receive an input electrical signal and acquires an induced electrical signal according to the electromagnetic signal generated by the input electrical signal. The electromagnetic transformer 111 may be at least one of a transformer, a Hall sensor, a voltage transformer, or a current transformer. The induced electrical signal output by the electromagnetic transformer 111 is a voltage signal or a current signal.

The transforming assembly 112 is connected to an output end of the electromagnetic transformer 111 to transform the induced electrical signal into the detection level. In an embodiment, the transforming assembly 112 is a signal amplification circuit, such as an operational amplifier. The induced electrical signal output by the electromagnetic transformer 111 is transformed into the detection level by comparison and amplification operations of the operational amplifier.

Figure 4:
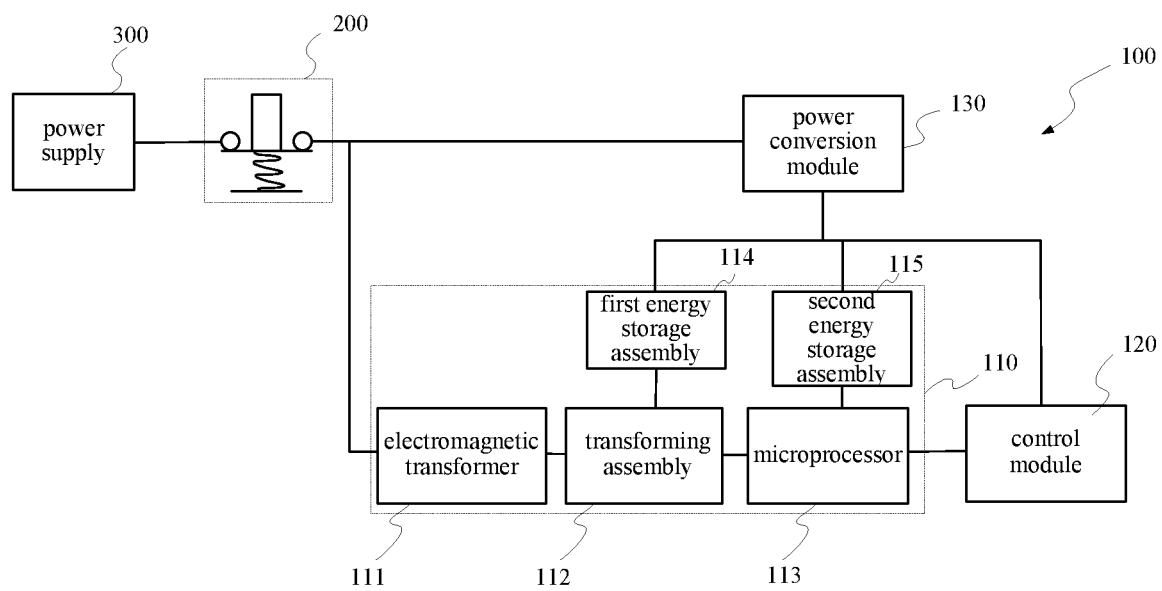
FIG. 4 is a schematic diagram of a flash switch on-off detection circuit according to another exemplary embodiment.

In one embodiment, as shown in FIG. 4, the flash switch on-off detection circuit 100 further includes a power conversion module 130. The power conversion module 130 has an input end connected to the power supply 300 through the flash switch 200, and an output end connected to the control module 120 and the transforming assembly 112, respectively.

The AC is transformed into a stable DC by the power conversion module 130 to supply power for the control module 120 and the transforming assembly 112. For example, when the transforming assembly 112 includes an active signal amplification circuit, normal operation of the transforming assembly 112 can be kept by the power conversion module 130.

Figures 1, 5:
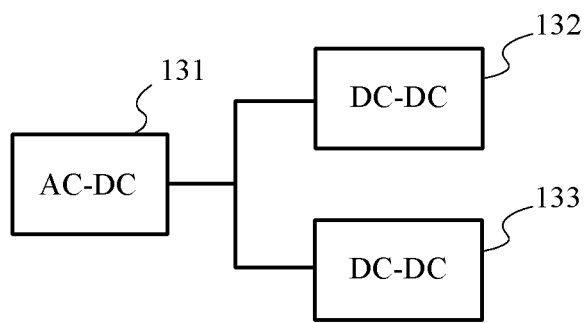
Figures 2, 5:
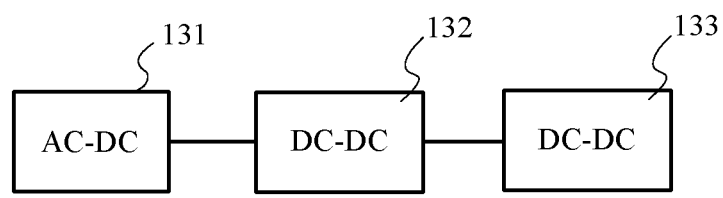

In some embodiments, as shown in FIG. 5-1 and FIG. 5-2, the power conversion module 130 includes a DC-AC conversion unit 131, a first DC-DC conversion unit 132, and a second DC-DC conversion unit 133. In FIG. 5-1, the first DC-DC conversion unit 132 and the second DC-DC conversion unit 133 are connected in parallel. In FIG. 5-2, the first DC-DC conversion unit 132 and the second DC-DC conversion unit 133 are connected in series.

In the case that the flash switch 200 is in the switching-on state, normal operation of the transforming assembly 112 and the control module 120 can be maintained by the power conversion module 130. If the transforming assembly 112 and the control module 120 cannot operate at an instant when the flash switch 200 is switched off, the normal operation of the detection circuit can be maintained in the manners below.

Still referring to FIG. 4, the on-off detection module 110 further includes a microprocessor 113 (e.g., a single chip) connected to the transforming assembly 112, and an energy storage assembly 114 connected to the microprocessor 113 and the transforming assembly 112. In this case, the output end of the on-off detection module 110 is an output end of the microprocessor 113.

When the flash switch 200 is in the switching-off state, the energy storage assembly 114 supplies power for the microprocessor 113 and the transforming assembly 112. The microprocessor 113 is also connected to the output end of the transforming assembly 112, for receiving and storing the detection level.

In this way, in the case that the flash switch 200 is switched off and the power conversion module 130 cannot supply power for the transforming assembly 112 and the control module 120, the normal operation of the transforming assembly 112 can be maintained by using the energy storage assembly 114, and the detection level output by the transforming assembly 112 is stored in the microprocessor 113. When the flash switch 200 returns to the switching-on state, the power conversion module 130 supplies power to the control module 120, and the control module 120 can read the detection level stored in the microprocessor 113 to further detect that the flash switch 200 has undergone an one-time on-off state change. In this way, lacking detection caused by switching off the power can be avoided, and the detection accuracy and the operation stability of the overall detection circuit can be improved.

In the embodiment, the energy storage assembly 114 has capacity to supply power to the transforming assembly 112 and the microprocessor 113 for at least 100 ms in case that the flash switch 200 is in a switching-off state. As a result, it may be ensured that the transforming assembly 112 outputs the detection level, and the microprocessor 113 receives and stores the detection level such that continuous monitoring after switching off the power can be realized.

In an embodiment, the energy storage assembly 114 includes a first energy storage assembly that supplies power to the transforming assembly 112, and a second energy storage assembly that supplies power to the microprocessor 113. In an embodiment, the energy storage assembly 114 is a capacitor.

Figure 6:
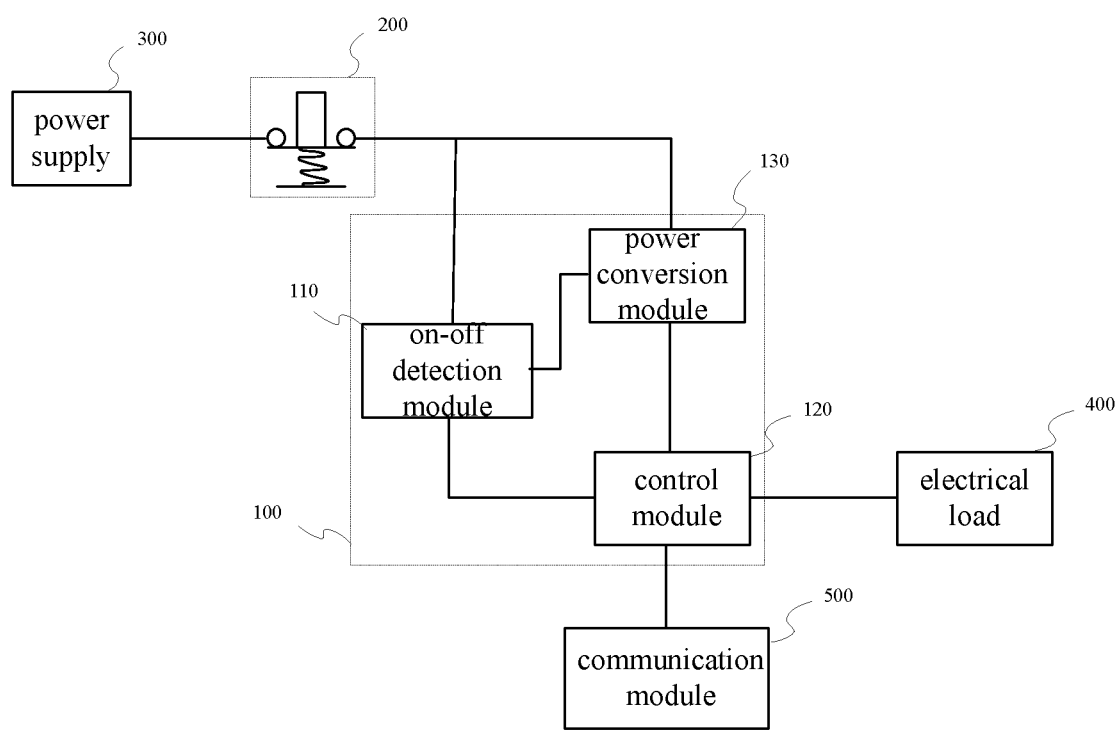
FIG. 6 is a schematic diagram of an electronic device according to one exemplary embodiment.

FIG. 6 is a schematic diagram of an electronic device according to an exemplary embodiment. The electronic device includes the flash switch 200 and the flash switch on-off detection circuit 100 described above.

In one embodiment, the electronic device further includes an electrical load 400. The control module 120 in the flash switch on-off detection circuit 100 is also used for adjusting and controlling a working state of the electrical load 400 according to the on-off change of the flash switch 200.

In an embodiment, when the electronic device is a lighting device, the electrical load is a light emitting device. At this time, the control module 120 adjusts and controls the working state of the electronic device to the lighting state or the switching-off state according to a one-time on-off state change of the flash switch 200. In an embodiment, the control module 120 adjusts and controls the working state of the electronic device to a first brightness illumination state or a second brightness illumination state according to the one-time on-off state change of the flash switch 200.

The electronic device may also be an intelligent hot water kettle, an intelligent sound box, an intelligent television, etc. The embodiment of the present disclosure is not specifically limited.

In one embodiment, the electronic device further includes a communication module 500. The communication module 500 is used to send the working state information of the electrical load to an external device, or receive a control instruction sent by the external device. In addition, the communication module 500 is connected with the control module 120 in the flash switch on-off detection circuit 100, such that information transmission between the communication module 500 and the control module 120 can be achieved.

In an embodiment, the external device is a host computer used together with the electronic device, such as a mobile phone, a personal computer, a gateway, etc. In this way, the electronic device can upload the current working state to the external device, such that the user can monitor the electronic device in real time, thereby improving use safety of the equipment and optimizing the user experience.

In an embodiment, the communication module 500 may be a wireless communication module, for example, a ZigBee communication module, a BLE communication module, a WiFi communication module, an infrared communication module, or an ISM band communication module.

Other implementations of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. An on-off detection circuit for a flash switch, comprising:
   an on-off detection module and a control module;
   wherein an input end of the on-off detection module is connected with a power supply through the flash switch, the on-off detection module is configured to acquire a digital signal as a detection level according to an electromagnetic signal generated by an input current;
   an input end of the control module is connected with an output end of the on-off detection module, to receive the detection level and determine an on-off state change of the flash switch directly according to a type of the detection level; and the on-off detection module comprises:
an electromagnetic transformer for receiving the input current and acquiring an induced electrical signal according to the electromagnetic signal generated by the input current; and
a transforming assembly connected with an output end of the electromagnetic transformer, for transforming the induced electrical signal into the detection level,
wherein the electromagnetic transformer is at least one of a transformer, a Hall sensor, a voltage transformer, or a current transformer, and the transforming assembly comprises an operational amplifier,
wherein the on-off detection module further comprises:
a microprocessor connected with an output end of the transforming assembly, for receiving and storing the detection level; and
an energy storage assembly connected with the transforming assembly and the microprocessor, for supplying power to the transforming assembly and the microprocessor when the flash switch is in a switching-off state;
wherein the energy storage assembly has capacity to supply power to the transforming assembly and the microprocessor for at least 100 ms when the flash switch is in a switching-off state.

2. The circuit according to claim 1, wherein the energy storage assembly comprises:
a first energy storage assembly for supplying power to the microprocessor; and
a second energy storage assembly for supplying power to the transforming assembly.

3. The circuit according to claim 1, further comprising:
a power conversion module;
wherein an input end of the power conversion module is connected with the power supply through the flash switch, and an output end of the power conversion module is connected with the control module and the transforming assembly, respectively, and
the power conversion module includes a DC-AC conversion unit, a first DC-DC conversion unit, and a second DC-DC conversion unit.

4. An electronic device, comprising:
a flash switch; and
an on-off detection circuit for the flash switch, the on-off detection circuit including an on-off detection module and a control module;
wherein an input end of the on-off detection module is connected with a power supply through the flash switch, the on-off detection module is configured to acquire a digital signal as a detection level according to an electromagnetic signal generated by an input current;
an input end of the control module is connected with an output end of the on-off detection module, to receive the detection level and determine an on-off state change of the flash switch directly according to a type of the detection level; and the on-off detection module comprises:
an electromagnetic transformer for receiving the input current and acquiring an induced electrical signal according to the electromagnetic signal generated by the input current; and
a transforming assembly connected with an output end of the electromagnetic transformer, for transforming the induced electrical signal into the detection level,
wherein the electromagnetic transformer is at least one of a transformer, a Hall sensor, a voltage transformer, or a current transformer, and the transforming assembly comprises an operational amplifier,
wherein the on-off detection module further comprises:
a microprocessor connected with an output end of the transforming assembly, for receiving and storing the detection level; and
an energy storage assembly connected with the transforming assembly and the microprocessor, for supplying power to the transforming assembly and the microprocessor when the flash switch is in a switching-off state;
wherein the energy storage assembly has capacity to supply power for the transforming assembly and the microprocessor for at least 100 ms when the flash switch is in a switching-off state.

5. The electronic device according to claim 4, further comprising:
an electrical load;
wherein the control module in the on-off detection circuit is configured to adjust and control a working state of the electrical load according to an on-off state change of the flash switch.

6. The electronic device according to claim 5, further comprising:
a wireless communication module for sending working state information of the electrical load to an external device or receiving control information sent by the external device.

7. The electronic device according to claim 4, wherein the energy storage assembly comprises:
a first energy storage assembly for supplying power to the microprocessor; and
a second energy storage assembly for supplying power to the transforming assembly.

8. The electronic device according to claim 4, wherein the on-off detection circuit further includes a power conversion module;
wherein an input end of the power conversion module is connected with the power supply through the flash switch, and an output end of the power conversion module is connected with the control module and the transforming assembly, respectively, and
the power conversion module includes a DC-AC conversion unit, a first DC-DC conversion unit, and a second DC-DC conversion unit.

* * * * *